(12) United States Patent
Knarren et al.

(10) Patent No.: US 8,817,228 B2
(45) Date of Patent: Aug. 26, 2014

(54) COOLING ARRANGEMENT AND LITHOGRAPHIC APPARATUS COMPRISING A RESILIENT WALL CREATING A GAP BETWEEN A DETECTOR MODULE HOUSING AND A HEAT SINK OF THE COOLING ARRANGEMENT

(75) Inventors: Bastiaan Andreas Wilhelmus Hubertus Knarren, Nederweert-Eind (NL); Raymond Turk, Riethoven (NL); Allard Eelco Kooiker, Waarle (NL); Nico Antonius Hubertus Johannes Boonen, Geldrop (NL)

(73) Assignee: ASML Netherland B.V., Veldhoven (NL)

( * ) Notice: Subject to any disclaimer, the term of this patent is extended or adjusted under 35 U.S.C. 154(b) by 762 days.

(21) Appl. No.: 12/750,337

(22) Filed: Mar. 30, 2010

(65) Prior Publication Data
US 2010/0259734 A1  Oct. 14, 2010

Related U.S. Application Data

(60) Provisional application No. 61/168,710, filed on Apr. 13, 2009.

(51) Int. Cl.
*G03B 27/52* (2006.01)

(52) U.S. Cl.
USPC .......................................................... 355/30

(58) Field of Classification Search
USPC .............................................. 355/30, 55, 53
See application file for complete search history.

(56) References Cited

U.S. PATENT DOCUMENTS

| | | |
|---|---|---|
| 5,969,441 A | 10/1999 | Loopstra et al. |
| 6,046,792 A | 4/2000 | Van Der Werf et al. |
| 6,573,640 B1 | 6/2003 | Hakamata et al. |
| 6,747,282 B2 | 6/2004 | Kroon et al. |
| 6,768,600 B2 | 7/2004 | Dieker |
| 7,088,397 B1 | 8/2006 | Hunter et al. |
| 7,213,963 B2 | 5/2007 | Lof et al. |
| 7,522,264 B2 | 4/2009 | Akamatsu |

(Continued)

FOREIGN PATENT DOCUMENTS

| | | |
|---|---|---|
| EP | 0 139 335 A2 | 5/1985 |
| EP | 1 439 427 A2 | 7/2004 |

(Continued)

OTHER PUBLICATIONS

Veggel, Marielle van, *The Basic Angle Monitoring system: picometer stability with Silicon Carbide optics*, Anna-Maria Arnoldina van Veggel, 235 pgs., 2007.

(Continued)

*Primary Examiner* — Chia-how Michael Liu
(74) *Attorney, Agent, or Firm* — Sterne, Kessler, Goldstein & Fox P.L.L.C

(57) ABSTRACT

A cooling arrangement is described and includes a heat sink having a first thermal contact surface, an object having a second thermal contact surface and a resilient wall. The first thermal contact surface and the second thermal contact surface face each other and define a gap. The resilient wall is part of an enclosure that surrounds a space at least comprising the gap, and the cooling arrangement includes a facility to maintain a pressure difference between the space and an environment of the cooling arrangement. Additionally, a lithographic apparatus comprising such a cooling arrangement is described.

17 Claims, 10 Drawing Sheets

(56) References Cited

U.S. PATENT DOCUMENTS

| | | | |
|---|---|---|---|
| 7,875,865 | B2 | 1/2011 | Scholz et al. |
| 7,907,255 | B2 | 3/2011 | Sengers et al. |
| 8,064,039 | B2 | 11/2011 | Shiraishi et al. |
| 2002/0101574 | A1 | 8/2002 | Tsuji |
| 2002/0145717 | A1 | 10/2002 | Baselmans et al. |
| 2004/0156640 | A1* | 8/2004 | Dress et al. .................. 398/140 |
| 2004/0211922 | A1 | 10/2004 | Kroon et al. |
| 2005/0008983 | A1 | 1/2005 | Wang |
| 2005/0078287 | A1 | 4/2005 | Sengers et al. |
| 2006/0221316 | A1 | 10/2006 | Yamamoto |
| 2006/0285226 | A1 | 12/2006 | Senba et al. |
| 2007/0071423 | A1 | 3/2007 | Fantone et al. |
| 2012/0075607 | A1 | 3/2012 | Knarren et al. |

FOREIGN PATENT DOCUMENTS

| | | |
|---|---|---|
| JP | 04-184912 A | 7/1992 |
| JP | 10-242313 A | 9/1998 |
| JP | 11-125554 A | 5/1999 |
| JP | 2003-068637 A | 3/2003 |
| JP | 2005-005707 A | 1/2005 |
| JP | 2005-064391 A | 3/2005 |
| JP | 2005-223275 A | 8/2005 |
| JP | 2006-278960 A | 10/2006 |
| JP | 2007-220910 A | 8/2007 |
| JP | 2009-021633 A | 1/2009 |
| JP | 2006-525590 A | 7/2009 |
| TW | 1263859 B | 10/2006 |
| WO | WO 98/40791 A1 | 9/1998 |
| WO | WO 99/26298 A1 | 5/1999 |
| WO | WO 2006/115186 A1 | 11/2006 |

OTHER PUBLICATIONS

International Search Report directed to related International Patent Application No. PCT/EP2010/051901, mailed Apr. 29, 2010, from the European Patent Office; 5 pages.

International Preliminary Report on Patentability with the Written Opinion of the International Searching Authority directed to related International Patent Application No. PCT/EP2010/051901, issued Oct. 18, 2011, from the International Bureau of WIPO; 9 pages.

1 Non-Final Rejection mailed Dec. 17, 2013 for U.S. Appl. No. 13/259,969, filed Dec. 14, 2011; 22 pages.

* cited by examiner

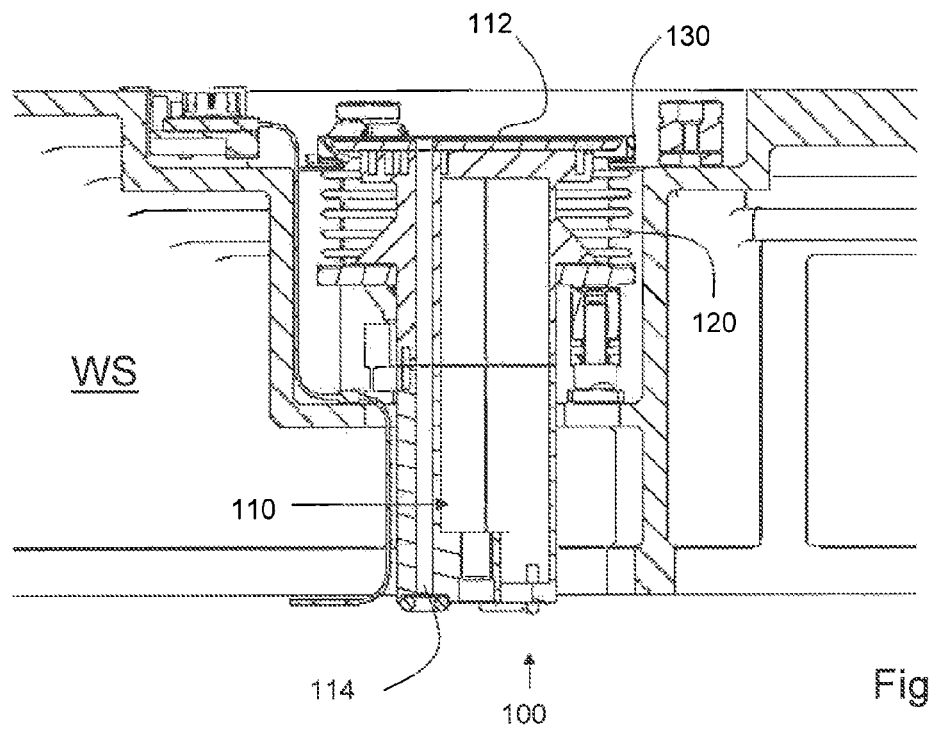
Fig. 6D
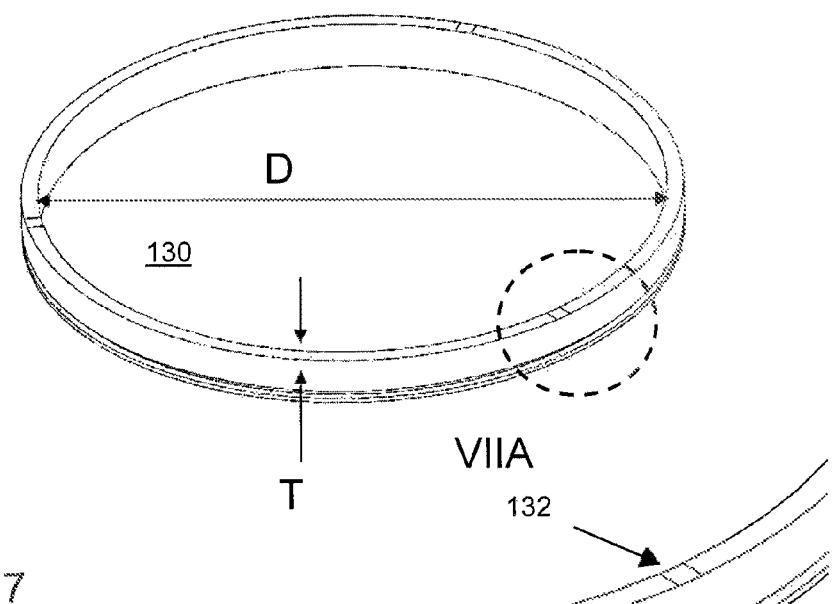
Fig. 7
Fig. 7A

COOLING ARRANGEMENT AND LITHOGRAPHIC APPARATUS COMPRISING A RESILIENT WALL CREATING A GAP BETWEEN A DETECTOR MODULE HOUSING AND A HEAT SINK OF THE COOLING ARRANGEMENT

CROSS REFERENCE TO RELATED APPLICATIONS

This patent application claims the benefit of U.S. Provisional Patent Application No. 61/168,710 filed on Apr. 13, 2009, entitled "Cooling Device, Cooling Arrangement And Lithographic Apparatus Comprising Cooling Arrangement", which is incorporated by reference herein in its entirety.

BACKGROUND OF THE INVENTION

1. Field of the Invention

The present invention relates to a cooling device, and further relates to a cooling arrangement. The present invention still further relates to a lithographic apparatus comprising a cooling arrangement.

2. Background Art

Lithography is a process used to create features on the surface of substrates. Such substrates can include those used in the manufacture of flat panel displays, circuit boards, various integrated circuits (ICs), and the like. A frequently used substrate for such applications is a semiconductor wafer. One skilled in the relevant art will recognize that the description herein also applies to other types of substrates. In such a case, the patterning structure may generate a circuit pattern corresponding to an individual layer of the IC, and this pattern can be imaged onto a target portion (e.g., comprising one or more dies) on a substrate (e.g., a silicon wafer) that has been coated with a layer of radiation-sensitive material (e.g., resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (with M<1) the speed V at which the substrate table is scanned will be a factor M times that at which the mask table is scanned. More information with regard to lithographic devices as here described can be gleaned, for example, from U.S. Pat. No. 6,046,792, incorporated herein by reference in its entirety.

In a manufacturing process using a lithographic projection apparatus, a pattern (e.g. in a mask) is imaged onto a substrate that is at least partially covered by a layer of radiation-sensitive material (e.g., resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are desired, then the whole procedure, or a variant thereof, should be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference in its entirety.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". The position of a second element traversed by the projection beam relative to a first element traversed by the projection beam will for simplicity hereinafter be referred to as "downstream" of or "upstream" of the first element. In this context, the expression "downstream" indicates that a displacement from the first element to the second element is a displacement along the direction of propagation of the projection beam. Similarly, "upstream" indicates that a displacement from the first element to the second element is a displacement opposite to the direction of propagation of the projection beam. Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and International Patent Application Publication No. WO 98/40791, incorporated herein by reference in their entireties.

There is a desire to integrate an ever-increasing number of electronic components in an IC. To realize this, it is desirable to decrease the size of the components and therefore to increase the resolution of the projection system, so that increasingly smaller details, or line widths, can be projected on a target portion of the substrate. Therein the wavelength of the radiation may play an essential role. The shorter the wavelength, the more transistors can be etched onto the silicon wafer. A silicon wafer with many transistors may result in a more powerful, faster and/or less power consuming microprocessor. In order to enable processing with light of a shorter wave length, chip manufacturers developed a lithography process known as Extreme Ultraviolet Lithography (EUVL). In this process, transparent lenses are replaced by mirrors that are arranged in a vacuum environment.

In order to actually realize that the details at such high resolution are imaged with sufficient accuracy, the projection system and the mirrors forming the lens elements used in the projection system should comply with very stringent quality requirements. Despite the great care taken during the manufacturing of lens elements and the projection system, they both may still suffer from wavefront aberrations, such as, for example, displacement, defocus, astigmatism, coma and spherical aberration across an image field projected with the projection system onto a target portion of the substrate. The aberrations are sources of variations of the imaged line widths occurring across the image field. The imaged line widths at different points within the image field should be constant. If the line width variation is large, the substrate on which the image field is projected may be rejected during a quality inspection of the substrate. Using techniques such as phase-shifting (e.g., using phase-shifting masks), or off-axis illumination, the influence of wavefront aberrations on the imaged line widths may further increase.

During manufacture of a lens element, it may be advantageous to measure the wavefront aberrations of the lens element and to use the measured results to tune the aberrations in this element or even to reject this element if the quality is not sufficient. When lens elements are put together to form the projection system, it may again be desirable to measure the wavefront aberrations of the projection system. These measurements may be used to adjust the position of certain lens elements in the projection system in order to minimize wavefront aberrations of the projection system.

After the projection system has been built into a lithographic projection apparatus, the wavefront aberrations may be measured again. Moreover, since wavefront aberrations are variable in time in a projection system, for instance, due to deterioration of the lens material or lens heating effects from local heating of the lens material, it may be desirable to measure the aberrations at certain instants in time during operation of the apparatus and to adjust certain movable lens elements accordingly to minimize wavefront aberrations. It may be desirable to measure the wavefront aberrations frequently due to the short time scale on which lens-heating effects may occur.

United States Patent Application Publication No. 2002/0145717, which is incorporated herein by reference in its entirety, describes a wavefront measurement method that uses within the lithographic apparatus a grating, a pinhole and a detector, e.g. CCD detector. The detector may have a detector surface substantially coincident with a detection plane that is located downstream of the pinhole at a location where a spatial distribution of the electric field amplitude of the projection beam is substantially a Fourier Transformation of a spatial distribution of the electric field amplitude of the projection beam in the pinhole plane. With this measurement system built into the lithographic projection apparatus it is possible to measure in situ the wavefront aberration of the projection system.

In another measurement, a transmission image sensor (TIS) is used as the detector to determine relative positions of the wafer and reticle stages. During a TIS scan, the wafer stage carrying the TIS modules, moves in 3D across the aerial images of the TIS object marks on the reticle (or fiducial) created by the projection optics of the scanner. In the case of EUV lithography such aerial images for the TIS fine scans are narrow, e.g. in the order of 50 nm wide lines at wafer level. The sensor marks on the TIS carry similar lines (100 nm wide). A perfect overlap of the object and the corresponding sensor mark results in a maximum signal on the detector. A scan with a combination of x- and y-marks (lines along y and x directions) gives the aligned position, i.e., when the position of the wafer stage (x,y,z) at which the TIS-sensor mark is aligned to an aerial image of a TIS-object mark at a given reticle stage position and orientation (x, y, z, Rx, Ry, Rz).

A detector used in lithographic apparatus is heated by the radiation impingent thereon, as well as by the heat developed therein, e.g. by operation of electric circuitry therein. The detector cannot easily lose this heat as it is arranged in a vacuum environment, which does not allow for heat transport by conduction or convection.

It has been considered to mount the detector at or integrate with a heat sink that is cooled by a cooling liquid. However, the flow of the cooling liquid causes vibrations that would render the measurement of the detector unreliable.

Hence there is a need to provide for a device that allows for an efficient cooling and a stable positioning of an object, in particular a detector, such as an optical detector, arranged in an evacuated space.

BRIEF SUMMARY OF THE INVENTION

According to an embodiment of the invention there is provided a cooling arrangement including a heat sink having a first thermal contact surface, an object having a second thermal contact surface, and a resilient wall, wherein the first thermal contact surface and the second thermal contact surface face each other and define a gap, wherein the resilient wall is part of an enclosure that surrounds a space at least comprising the gap, and wherein the cooling arrangement includes a facility to maintain a pressure difference between the space and an environment of the cooling arrangement.

In an embodiment, the gap mechanically decouples the object from the heat sink so that transmission of possible vibrations from the heat sink to the detector module, e.g. caused by the flow of a cooling liquid, is mitigated. Nevertheless, the gap between the detector module and the heat sink is at least substantially separated from the environment of the cooling arrangement, so that the space comprising the gap can be filled with a gas, even if the cooling arrangement is arranged in a vacuum environment. The gap filled with the gas allows for an efficient transport of heat from the detector module to the heat sink. The object to be cooled may be an optical component, but may alternatively be a detector as is described in more detail below. It is noted that United States Patent Application Publication No. 2005/0008983, which is incorporated herein by reference in its entirety, describes an apparatus for supporting a workpiece in a process chamber. The apparatus includes a first "hot" chuck having a surface for supporting the workpiece, the hot chuck including electrical heating elements for heating the hot chuck, and a second "cold" chuck having a fluid path formed therein for circulating a thermal transfer fluid. The cold chuck can be selectively movable towards and away from the hot chuck to vary a rate of heat transfer between the hot chuck and the cold chuck. The process chamber is used to carry out various processing steps. In a preferred embodiment of the known apparatus, a gas is continuously injected into the gap between the chucks. This allows heat to be transferred from the hot chuck to the cold chuck by "free convection" and (to some extent) conduction through the gas.

In an environment such as the EUV lithographic apparatus that requires a vacuum environment, this apparatus is not applicable. In that case, the gas in the gap between the chucks would disappear, therewith preventing a heat transfer. It could be considered to bring the chucks in direct physical contact with each other. However the chuck cooled by the thermal transfer liquid is subject to vibrations due to the flow of the liquid. If the chucks were in direct physical contact with each other, these vibrations would be passed to the workpiece. For lithographic exposure or calibration steps, however, a very accurate positioning of the workpiece is required.

Most suitable gases for this purpose are $H_2$ and He, having light molecules, although other gases such as $N_2$ may be used.

An embodiment of the cooling arrangement includes a facility for providing a gas into the enclosed space. Gases like $H_2$ and He escape relatively easily through a wall. It is therefore favorable that a facility is provided for supplying a gas into the enclosed space. In that way the pressure of the gas can be maintained at a predetermined level e.g. dependent on the amount of cooling required under the circumstances. The facility for supplying also makes it possible to wash the enclosed space with an inert gas, such as N2, for safety purposes.

The resilient wall, in addition to being made of a flexible material, may have a shape that further supports its flexibility. In an embodiment, the resilient wall is a bellows. A bellows allows free movement in 5 degrees of freedom of the part to be cooled. Only a constraint in Rz remains, but no mechanical load is exerted in this way.

In an embodiment, the resilient wall extends between the first thermal contact surface of the heat sink and the second thermal contact surface of the detector module. Preferred is, however, an embodiment wherein the resilient wall surrounds the heat sink. In that preferred embodiment, the resilient wall can have a relatively large height, therewith allowing for a high dampening of vibrations, while the gap between the thermal contact surfaces can be relatively small, allowing for a high heat-transfer rate.

In an embodiment, the resilient wall has a first end that is assembled with at least one of the detector module and the heat sink, and a second end that is provided with a sealing ring that is pressed by a tension in the resilient wall to the other one of the detector module and the heat sink. For example the heat sink has a flange to which the resilient wall is coupled at its first end, while the sealing ring is pressed at its second end to the second thermal contact surface of the detector module. This also removes the need for additional fixation elements, e.g. bolts, and thereby facilitates an easy installation.

By fine tuning stiffness of the resilient wall, compression length and support stiffness', the spring-load allows positioning of the seal and prevents any relative movement (e.g., during acceleration) while not disturbing the part to be cooled statically.

In an embodiment, the sealing ring is provided with at least one groove at a side facing the other one of the object and the heat sink. In another embodiment, a supply tube is provided that ends in the enclosed space near the heat sink. In the before-mentioned example, the at least one groove is present in the side that is pressed against the second thermal contact surface of the object. In this way, a controlled amount of leakage from the enclosed space to the environment of the cooling arrangement is achieved. This leakage can be used as an outlet to rapidly flush the enclosed space with an inert gas such as $N_2$, in case of an emergency situation. It is not necessary to provide for a separate outlet. The latter would require a separate exhaust tube, which is undesirable. Also, leakage from the enclosed space to the environment of the cooling arrangement is more reproducible, which facilitates the design and operation of the installation that maintains the vacuum in the vacuum chamber forming the environment.

In an embodiment, a detector module preferably includes at least one detector for sensing photon radiation, an electronic circuit coupled to the at least one detector, and a housing having a first and a second body, each having a bottom part and an at least partially cylindrical part extending from the bottom part, wherein the at least partially cylindrical part of the first body is thermally coupled with the at least partially cylindrical part of the second body, wherein the at least partially cylindrical part of the first body extends towards the bottom part of the second body, and wherein the electronic circuit is arranged inside the housing. The cylindrical part is not necessarily circularly cylindrical. For example the cylindrical part may have a rectangular or triangular cross-section. A circular-cross-section is however preferred for manufacturing purposes.

In an embodiment, the electronic circuit for pre-processing the detector signals is arranged within a housing comprised in the detector module. Therewith the electronic circuit is close to the detector so that the detector signals to be preprocessed are relatively noise-free. The pre-processing may include amplification, A/D-conversion and the like. The housing, including the first and the second bodies can be rapidly assembled with the electronic circuit by arranging the first body with its at least partially cylindrical part within the at least partially cylindrical part of the second body. The relatively modest space available for the detector module is efficiently used as the cylindrical parts extend from the periphery of the bottom parts. Furthermore, as the cylindrical parts are at the periphery of the bodies, a large contact surface is available for heat transfer along the wall of the housing. Therewith the electronic circuit is efficiently protected against heat, and thermal expansion of parts of the sensor module is reduced.

For testing purposes, a dummy detector module may be used. This module has the housing as described above, but has no detector or electronic circuitry.

In an embodiment of the detector, the at least partially cylindrical part of the first body is thermally coupled with the at least partially cylindrical part of the second body in that the cylindrical part of the first body is clamped within the at least partially cylindrical part of the second body. This may be realized by manufacturing the first and the second bodies with a narrow tolerance. By pre-cooling the first body or by pre-heating the second body, a temporary play is provided between the bodies allowing for an easy assembly.

In an other embodiment, the at least partially cylindrical part of the first body is thermally coupled with the at least partially cylindrical part of the second body by a heat conductive adhesive layer arranged between an outer surface of the at least partially cylindrical part of the first body and an inner surface of the at least partially cylindrical part of the second body. This has the advantage that even if there is a tolerance between the bodies after assembly, a good heat transfer can still be achieved via the adhesive layer.

In an embodiment, the housing comprises a ceramic material. Many ceramic materials have the advantage of a relatively low thermal expansion coefficient and, even more importantly, a relatively good heat conduction. A low thermal expansion coefficient is favorable for the positional accuracy of the detector, which is particularly important for lithographic applications. If the material provides for a good heat conduction, the resulting thermal expansion will be even smaller as temperature variations can be limited too. Also, many ceramic materials have a good electrical conductivity. A housing of such a material protects the detector and the electronic circuit from perturbation or damage by electrostatic discharges.

A particular suitable ceramic material comprises SiC. Various materials based on SiC, such as reaction bonded SiC (e.g. SiSiC), have a low thermal expansion coefficient, a high thermal conductivity and a high electrical conductivity.

In an embodiment of the detector module, an outside surface of the bottom part of one of the bodies carries a grating formed on a substrate, wherein the grating is arranged above an opening in the bottom part and the detector is arranged inside the housing opposite the grating. This detector module is in particular suitable for performing waveform measurements in a lithographic apparatus.

In another embodiment of the detector module, an outside surface of the bottom part of one of the bodies carries the detector. This detector module is in particular suitable to determine relative positions of the wafer and reticle stages in a lithographic apparatus.

The cooling arrangement wherein the detector module is applied is particularly suitable for use in a lithographic apparatus, in particular in an EUV lithographic apparatus.

Hence, according to an embodiment, there is provided a lithographic apparatus including an EUV source and a vacuum chamber having arranged therein an imaging system configured to direct electromagnetic radiation from the source at an object plane so as to illuminate the object plane, a first grating positioned in the object plane, a projection optical system configured to project an image of the first grating onto a focal plane, and a cooling arrangement according to embodiments of the present invention, wherein the detector module is configured to receive the image projected by the projection optical system.

An embodiment of the lithographic system is characterized in that the bottom part of the first body faces the projection optical system. This is particular advantageous if the bodies of the housing are attached to each other by an adhesive. In this orientation, the slit between the at least partially cylindrical walls of the first and the second bodies faces away from the projection optical system. In this way, UV-radiation impinging on the adhesive is prevented. This is also advantageous if components of the lithographic apparatus are cleaned by using reactive gases, such hydrogen radicals, as in this arrangement a direct contact between the hydrogen radicals and the reactive gases is prevented.

Although the cooling device according to the present invention is particularly suitable to form a cooling arrangement with a detector module for use in a lithographic apparatus, it may be applied for alternative purposes too.

Hence, according to an embodiment, there is provided a cooling device, including a heat sink having a first thermal contact surface, and a resilient wall having a first end that is assembled with the heat sink, and a second end that is provided with a sealing ring for receiving thereon a first surface of an object to be cooled, wherein in a state wherein the object to be cooled is applied at the sealing ring of the cooling device, the first and the second thermal contact surfaces define a gap, the resilient wall being part of an enclosure that at least substantially separates a space at least comprising the gap from an environment of the cooling device.

According to a further embodiment, a method of measuring a wavefront includes directing electromagnetic radiation from a source to an object plane so as to illuminate the object plane, projecting an image of a first grating positioned in the object plane onto a focal plane at a detector module, and cooling the detector module using a heat sink and a resilient wall, such as described in the embodiments discussed above. Wavefront aberrations caused, for example, by an optical system in the optical path of the electromagnetic radiation can then be inspected or measured at the focal plane. The cooling of the detector module prevents various negative effects on the operation of the detector module caused by heat, for example, from the electromagnetic radiation and/or by the circuitry found within the detector module.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 1 schematically shows an embodiment of a lithographic apparatus, according to the present invention.

FIG. 2 schematically shows a wavefront measurement in the apparatus of FIG. 1.

FIG. 6D shows an arrangement of the cooling device within the wafer stage of the lithographic apparatus, according to an embodiment of the present invention.

FIG. 7 shows a part of the cooling device, according to an embodiment of the present invention.

FIG. 7A shows a detail of the part of the cooling device shown in FIG. 7, according to an embodiment of the present invention.

One or more embodiments of the present invention will now be described with reference to the accompanying drawings. In the drawings, like reference numbers may indicate identical or functionally similar elements.

DETAILED DESCRIPTION OF THE INVENTION

Figure 1:
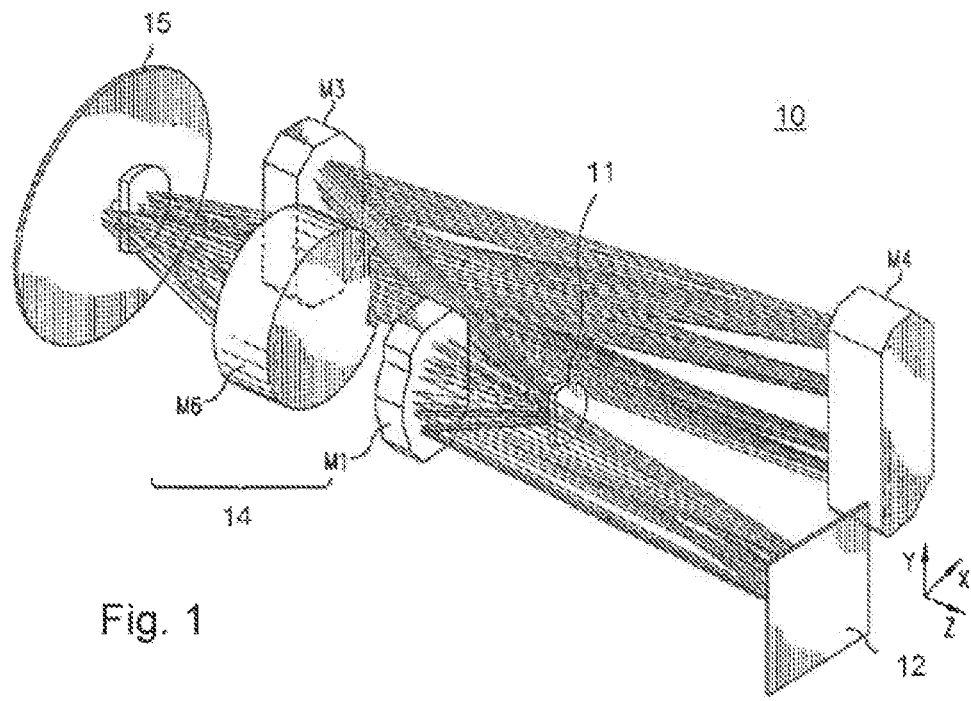

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s)

described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

In the following detailed description, numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention. The invention may be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 schematically illustrates a portion of an EUV photolithographic system 10, which includes an EUV source (not shown in FIG. 1). The system 10 also includes image optics (including mirrors M4 and M3), a pupil 11, a reticle 12 mounted on a reticle stage (RS, not shown) with an image of a pattern to be imaged onto a wafer 15, and projection optics (PO) 14 mirrors M1 and M6. The EUV radiation is projected onto wafer 15, which is mounted on a wafer stage (WS, not shown). It will be appreciated that the reticle 12 is reflective in EUV systems, unlike photolithographic systems operating at longer wavelengths, such as deep ultraviolet, or visible, where the reticle 12 is usually transmissive.

Figure 2:
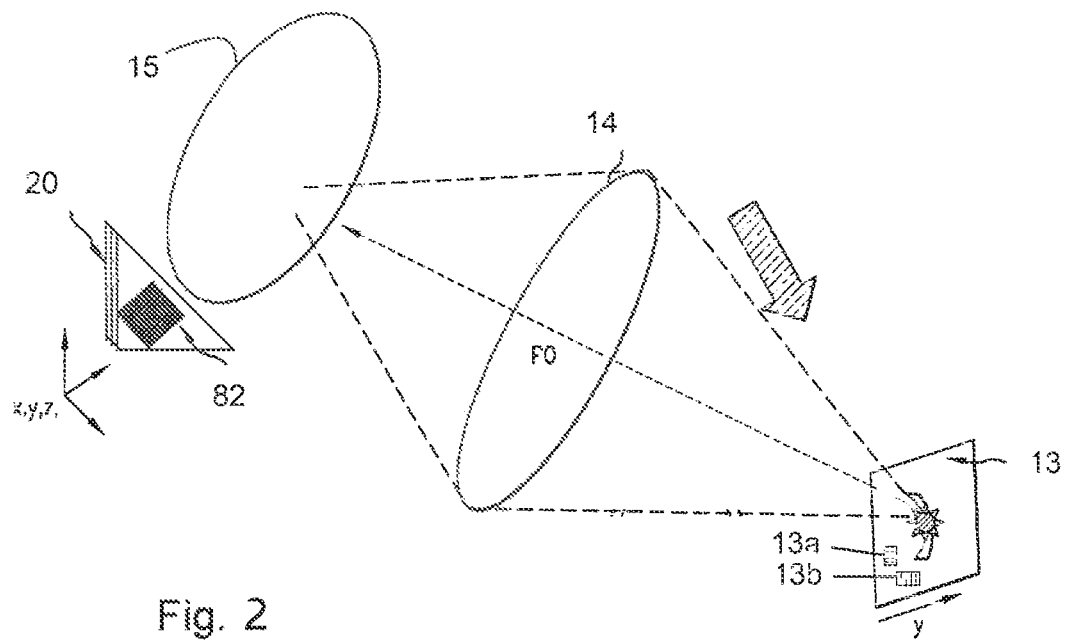

FIG. 2 is an illustration of the wavefront measurement arrangement wherein the present invention may be applied, particularly as it can be incorporated into a photolithographic system. In FIG. 2, parts corresponding to those in FIG. 1 have the same reference number. As may be seen in FIG. 2, the source module 13 is placed on the reticle stage, and in one embodiment includes two orthogonally oriented gratings 13a, 13b. The wavefront detector (or detector module 20) is placed on the wafer stage. The detector and source modules 20, 13 may also be referred to as a wavefront sensor (WFS).

The detector module 20, which will be described in more detail below, includes, among other elements, a 2-D grating and a CCD detector that is positioned below the 2-D grating.

The projection optics (PO) 14 remain the same as during normal exposure operation, e.g. as shown in FIG. 1.

The wavefront can be measured when imaging is not being performed. In order to measure the wavefront, the reticle stage is moved, such that one of the gratings 13a, 13b in the source module 13 on the reticle stage is placed in the optical path, rather than the reticle 12 itself. The wafer stage is also moved such that the wavefront detector is positioned to receive an image of the source module grating 13a, 13b. The projection optical system PO then projects an image of the first grating 13a,13b at a second grating 82 in the focal plane. The second grating 82 recombines diffracted waves. Wavefront aberrations caused by the optical system PO become visible as an interference pattern, which can be inspected by a wavefront sensor 30 (FIG. 5) in the detector module 20, such as a CCD-camera. After this measurement, the reticle stage can then be moved to place a different diffraction grating in the optical path, so as to measure the wavefront with an orthogonal orientation of the source module grating 13a, 13b.

Figure 3A:
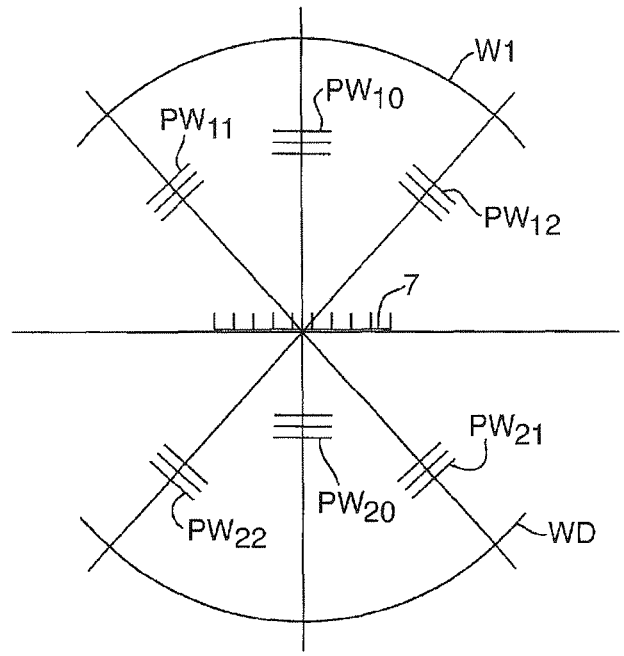
FIG. 3A shows a first aspect of the wavefront measurement of FIG. 2 in more detail.
Figure 3B:
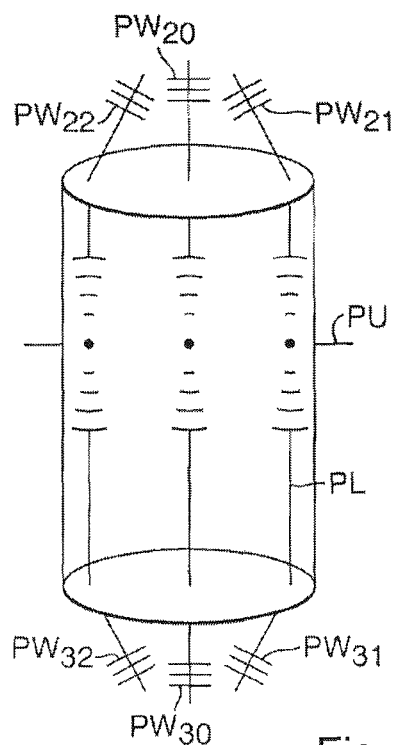
FIG. 3B shows a second aspect of the wavefront measurement of FIG. 2 in more detail.
Figure 3C:
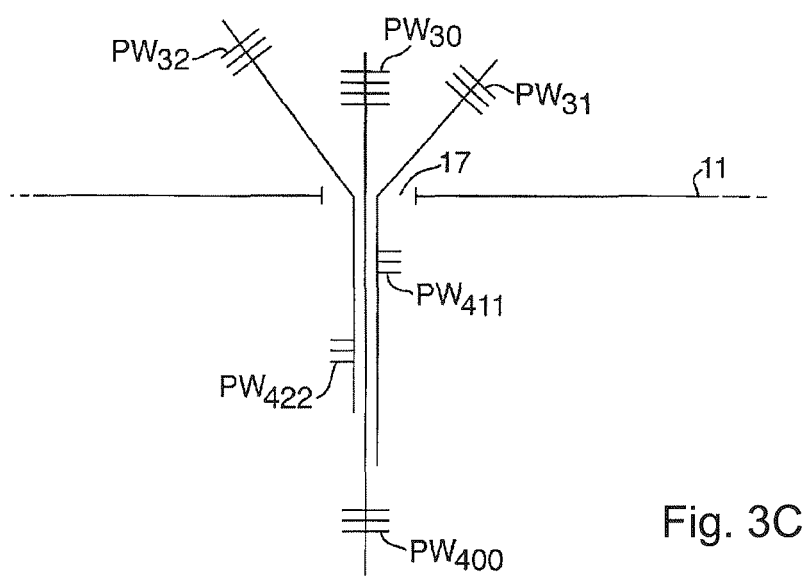
FIG. 3C shows a third aspect of the wavefront measurement of FIG. 2 in more detail.

FIGS. 3A-3C describe this measurement in more detail.

As illustrated in FIG. 3A, in this measurement system a component, plane wave $PW_{10}$ of wave W1 is diffracted by the grating as an emanating wave WD. The wave WD emanating from the grating can be considered as a sum of diffracted plane waves $PW_{2i}$, [i=0, 1, 2 . . . ]. The plane waves $PW_{22}$, $PW_{20}$ and $PW_{21}$ are, respectively, the +1st, 0th and −1st diffracted order of the incoming wave $PW_{10}$. In the projection system schematically shown in FIG. 3B the plane waves $PW_{2i}$, [i=0, 1, 2 . . . ] will focus near or at the pupil plane PU, and sample the pupil plane in three points. The aberrations of the projection system PL can be thought of as phase errors that are endowed on the focused plane waves $PW_{2i}$, [i=0, 1, 2 . . . ] in the pupil plane PU. These focused plane waves will exit the lens as plane waves $PW_{3i}$, [i=0, 1, 2 . . . ], respectively. As shown in FIG. 3C, to measure the phase errors representative of the lens aberrations, the plane waves $PW_{3i}$, [i=0, 1, 2 . . . ] are directionally recombined by diffraction at the pinhole 17 in a pinhole plate 11. For instance, $PW_{400}$ is the $0^{th}$ order diffracted wave originating from $PW_{30}$, $PW_{411}$ is the $+1^{st}$ order diffracted wave from $PW_{31}$ and $PW_{422}$ is the $-1^{st}$ order diffracted wave originating from $PW_{32}$ and these directionally recombined waves can interfere. Their interference intensity is harmonic with the phase stepping of the grating. Other recombinations of diffracted waves originating from the $PW_{3i}$ [i=0, 1, 2 . . .], are possible as well. However, the intensity resulting from the interference of such recombination varies as a higher harmonic of the phase stepping movement of the grating. Such higher order harmonic signals can be filtered out from each CCD-pixel signal.

Figure 4:
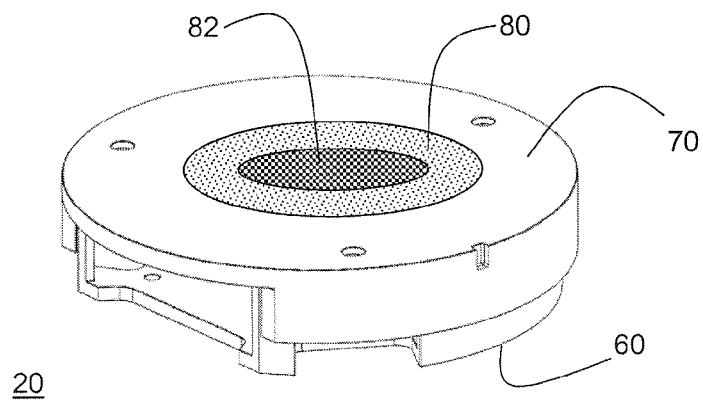
FIG. 4 shows in perspective view a first embodiment of a detector module according to the present invention.
Figure 5:
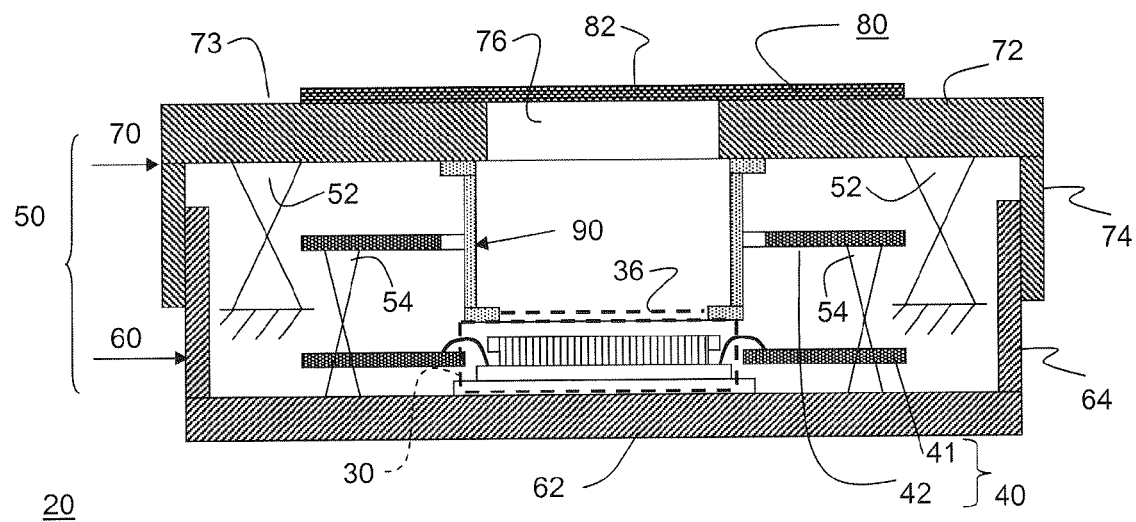
FIG. 5 shows a cross-section of the first embodiment of the detector module shown in FIG. 4, according to an embodiment of the present invention.

FIGS. 4 and 5 show an embodiment of a detector module 20 according to the invention in more detail. Therein FIG. 4 shows a perspective view and FIG. 5 shows a cross-section of the embodiment.

The detector module 20 includes at least one detector 30, here a CCD-detector, for sensing radiation, an electronic circuit 40 coupled to the at least one detector module 30, and a housing 50. The detector 30 is arranged at a spacer, e.g. of SiC, for defining a proper position of the detector 30 with respect to a bottom part 62. The housing 50 has a first body 60 and a second body 70 each having a bottom part 62, 72 and an at least partially cylindrical part 64, 74 extending from the bottom part 62, 72. The at least partially cylindrical part 64 of the first body 60 is thermally coupled with the at least partially cylindrical part 74 of the second body 70. Therein the at least partially cylindrical part 64 of the first body 60 extends towards the bottom part 72 of the second body 70. The electronic circuit 40 includes a first and a second printed circuit board 41, 42 arranged inside the housing 50. In the embodiment shown the CCD-detector 30 is also arranged within the housing 50 below a 2D-grating 82. The 2D-grating 82 is formed in a wafer 80. The wafer 80 is arranged at an outer surface 73 of the bottom part 72 of the body 70. The portion of the wafer 80 forming the grating 82 is positioned above an opening 76 in the bottom part 70. In the embodiment shown the at least partially cylindrical part 64 of the first body 60 is thermally coupled with the at least partially cylindrical part 74 of the second body 70 in that the at least partially cylindrical part 64 of the first body 60 is clamped within the at least partially cylindrical part 74 of the second body 70. In the embodiment shown, the first and the second bodies 60, 70 are manufactured from a metal alloy, such as invar. Invar is an alloy of nickel and iron in a ratio of about 36% nickel and 64% iron. A minor amount of additional elements may be present. For example a particular invar alloy comprises 35.6% nickel, 0.1% manganese, 0.4% carbon and a remainder of iron. After glowing and cooling in air, the alloy has an expansion coefficient ($\alpha$) of only $1.2 \cdot 10^{-6}$ $K^{-1}$ at room temperature. Due to the thermal coupling between the bodies 60, 70, heat developed inside the housing 50 or received by the housing 50 can be efficiently conducted, from the second body 70 to the first body 60 and subsequently to a carrier (not shown) at which the housing 50 is arranged. Likewise the tight contact between the bodies 60, 70 allows for an efficient electrical conduction to an earth conductor. In this way, perturbation or damages due to electrostatic discharges can be prevented.

Another material that has an extremely low expansion coefficient ($\sim$$-0.02 \times 10^{-6}$/K at 0-50° C.) is a glass-ceramic known as Zerodur©, manufactured by Schott AG. It has both an amorphous (vitreous) component and a crystalline component. Similar materials are also available from other manufacturers.

To enable use of the detector module 20, even under extreme circumstances, the thermal expansion coefficient CTE is approximately the same as that of Si, e.g. in the range from 0 to $3*10^{-6}$ $K^{-1}$. The reason is that silicium (silicon) is often used as the substrate for various components to be mounted at the housing, e.g. the wafer 80 in FIG. 5. To connect the wafer and the housing, an adhesive layer may be used. The adhesive layer is preferably thin, e.g. in the order of 10 to 30 µm. As an example, EPOTEC 301 is used as the adhesive, being electrically insulating and having low outgassing properties.

In such extreme circumstances, the thermal conduction of the material of the housing 50 should be high, with a thermal conduction $\lambda$ preferably greater than 100 W/m.K. The requirements for thermal conductivity and thermal expansion are interrelated. If the material has a relatively high thermal conductivity, the thermal expansion may also be relatively high, because it provides for a better cooling.

In many cases, it is preferred that the electrical conductivity of the material of the housing is high. The electrical resistance of the material is preferably at most 10 $\Omega$.cm. When the housing has a low resistance, it can serve as a cage of Faraday, preventing damage or perturbation of the electronic circuitry inside the housing by electrostatic discharges. Materials complying with these requirements are ceramics like SiC or SiSiC having a very high thermal and electrical conductivity as well as a low expansion coefficient. These materials have a high overall stability as they enable an efficient cooling by conduction while the remaining temperature change leads to only minor expansion (displacements). A description of these materials is given in the thesis "The Basic Angle Monitoring system: picometer stability with Silicon Carbide optics" by M. van Veggel, (http://alexandria.tue.nl/extra2/200710084.pdf), which is incorporated herein by reference in its entirety.

In the embodiment shown, a cylindrical wall 90, e.g. of a metal, is arranged that ends at a first side at the opening 76 in the bottom part 72 of the body 70 and at a second side at the detector 30. Furthermore, the detector 30 is provided with a protection layer 36. The presence of the protector element makes it possible to clean the grating 82 with reactive gases, while it is in the lithographic apparatus, without damaging the detector. Suitable reactive gases are for example H* radicals. The cylindrical wall 90 also protects the electronic circuitry against EUV radiation.

In the embodiment of FIGS. 4 and 5, the second body 70 is mounted by flexible mounting elements 52 to the first body 60. Also the printed circuit boards 41, 42 are mounted by flexible mounting elements 54 to the first body 60.

Figure 6:
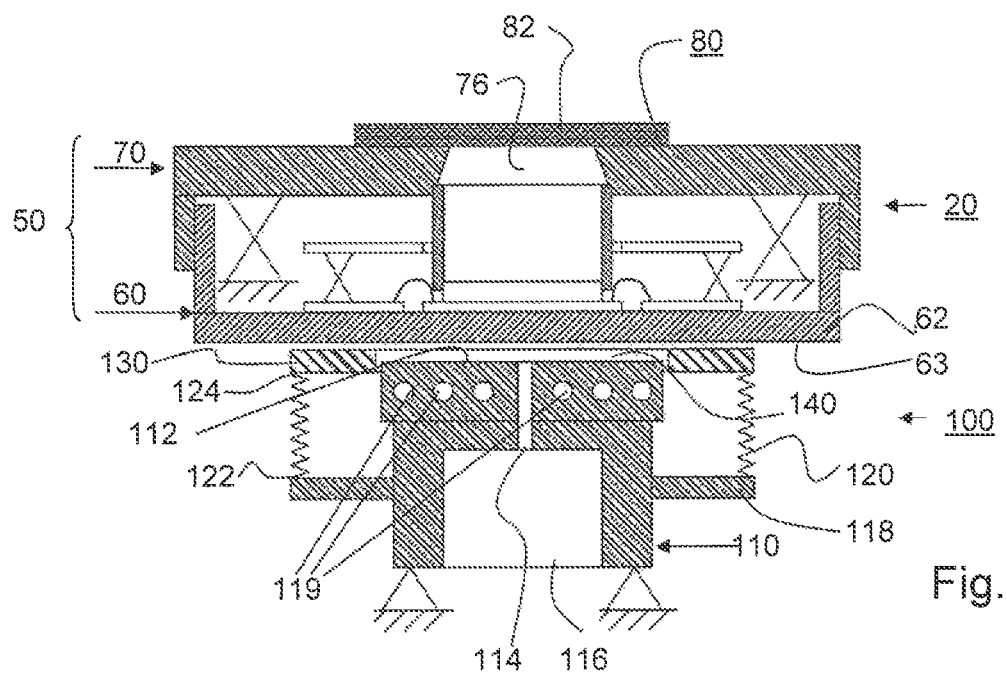
FIG. 6 shows an embodiment of a cooling arrangement according to the present invention.

FIG. 6 shows an embodiment of the detector module 20 where the detector module 20 is mounted at a cooling device 100. The detector module 20 and the cooling device 100 form a cooling arrangement.

The cooling device 100 includes a heat sink 110 having a first thermal contact surface 112 and a resilient wall 120 having a first end 122 that is assembled with the heat sink. The resilient wall 120 has a second end 124 that is provided with a sealing ring 130 for receiving thereon a first surface 63 of an object. Here the object to be cooled is the detector arrangement 20, and the first surface is formed by the outer surface 63 of the bottom part 62 of the first body 60 of the detector arrangement 20. In a state wherein the object to be cooled is applied at the sealing ring 130 of the cooling device, the first and the second thermal contact surfaces 112, 63 respectively define a gap 140. The resilient wall 120 is part of an enclosure that surrounds a space at least comprising the gap 140. In this case the enclosure is formed by the heat-sink, including a flange 118, the flexible wall 120, the sealing ring 130 and the bottom part 62 of the second body 60.

A facility is present to maintain a pressure difference between the surrounded space and an environment wherein the arrangement is arranged. As a pressure difference can be maintained, a gas may be present in the gap 140, allowing for an efficient heat transfer from the thermal contact surface 63 of the detector 20 and the thermal contact surface 112 of the cooling device 100. Nevertheless, these surfaces 63, 112 do not physically contact each other so that propagation of vibrations is suppressed. The heat-transport from the detector 20 to the cooling device 100 can be controlled by various parameters. An improved heat-transport may be obtained by reducing the width of the gap 140, by increasing the area of the thermal contact-surfaces 63, 112 and/or increasing the pressure of the gas. Very suitable gases are $H_2$ and He in view of their low molecule weight. In an embodiment, the width of the gap 140 is approximately 40 µm and the area of the contact-surfaces 63, 112 is approximately 1000 mm². Furthermore, $H_2$, having a pressure of 30 mbar, is used as the cooling gas. In this way the heat sink provides for a heat transport of 400 mW. Other gases like $N_2$ are also suitable, but are less efficient, or would require a higher pressure. In an embodiment, the enclosure alone forms the facility to maintain a pressure difference in that it is gas tight sealed from the environment. This may be realized for example by mounting the detector module 20 in a gas tight way to the second end 124 of the flexible wall 120 and filling the thus enclosed space with a gas.

It is not necessary, however, that the space is gas tight sealed. In the embodiment shown, the facility for maintaining a pressure difference includes a facility for providing a gas into the surrounded space. In the embodiment shown the facility for providing the gas is formed by a channel 114 for communicating with an opening 116. The opening 116 may be coupled to a gas supply (not shown).

Figure 6A:
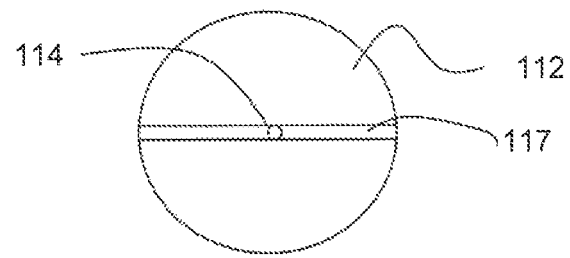
FIG. 6A shows a detail of a cooling device forming part of the cooling arrangement, according to an embodiment of the present invention.

In an embodiment shown in FIG. 6A, the channel 114 ends in at least one groove 117 in the second contact surface 112. This facilitates distribution of the gas within the gap 140. The groove 117 preferably extends to the periphery of the second contact surface 112. In this way, a constant pressure along the periphery of the gap is obtained. Therewith also a homogeneous pressure distribution within the gap is realized.

In the cooling arrangement shown in FIG. 6, the resilient wall 120 is a bellows. This allows the detector module 20 free movement in 5 degrees of freedom with respect to the heat sink 110. Only a constraint in Rz remains, i.e. rotation around an axis perpendicular to the surfaces 112, 63 that define the gap 140.

In the embodiment shown, the resilient wall 120 surrounds the heat sink 110. In this way, the resilient wall 120 can have a relatively large height, therewith allowing for a high dampening of vibrations, while the gap between the thermal contact surfaces can be relatively small, allowing for a high heat-transfer rate. In the embodiment shown, the bellows 120 has a height of 14 mm. The bellows 120 in this embodiment has a diameter of 40 mm and is manufactured of nickel having a thickness of 50 µm.

At one end 122, the resilient wall 120 is coupled, e.g. by welding, to a flange 118 arranged around the heat sink 110. At the other end 124 the resilient wall 120 has the sealing ring 130 that is pressed against the second thermal contact surface 63 of the object, the detector module 20. It would also be possible to permanently mount the resilient wall to the detector module 20, and have the sealing ring 130 press against the flange 118. In both cases additional fixation elements, like bolts, for mounting the detector module 20 with the cooling device 100 are superfluous, thereby making easy installation possible. By fine tuning stiffness of the resilient wall, compression length and support stiffness', the spring-load allows to position the seal and prevent any relative movement (e.g., during acceleration) while not disturbing the part to be cooled statically.

The heat sink 110 is provided with fluid channels 119. A fluid, e.g. a liquid such as water, may circulate through these channels 119 to drain heat transferred to the heat sink 110, in cases where insufficient heat is transferred by conduction through the material of the heat-sink, e.g. stainless steel. Alternatively, another material such as aluminium may be used, in particular where a high heat conduction without forced cooling by water is desired. A flow of liquid may induce vibrations. Also, other cooling means, e.g. a heat-pipe, may transmit vibrations. However, the flexible coupling 120 between the heat sink 110 and the detector module 20 suppresses propagation of such vibrations so that the operation of the detector module is not perturbed.

Figure 6B:
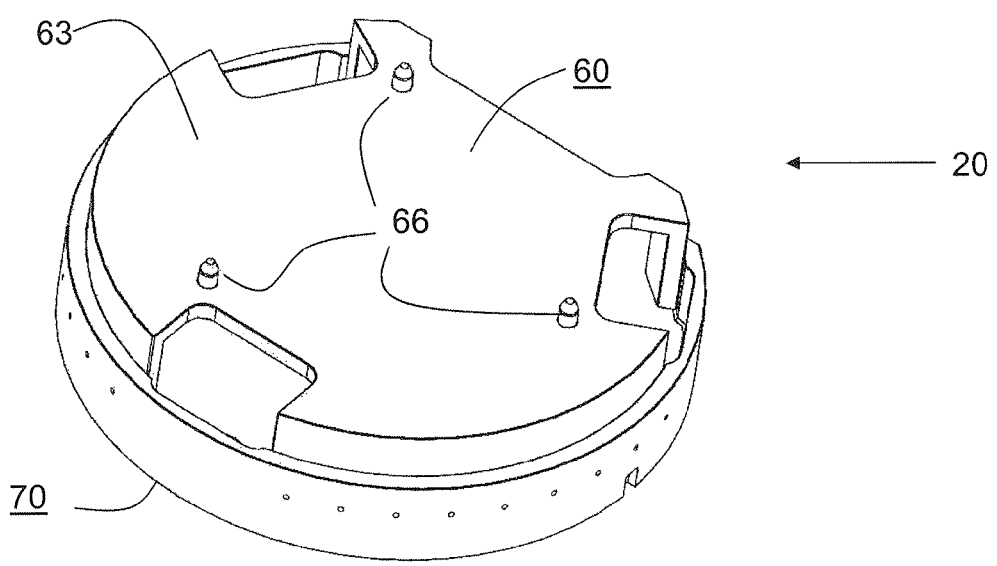
FIG. 6B shows a second embodiment of the detector module, according to the present invention.
Figure 6C:
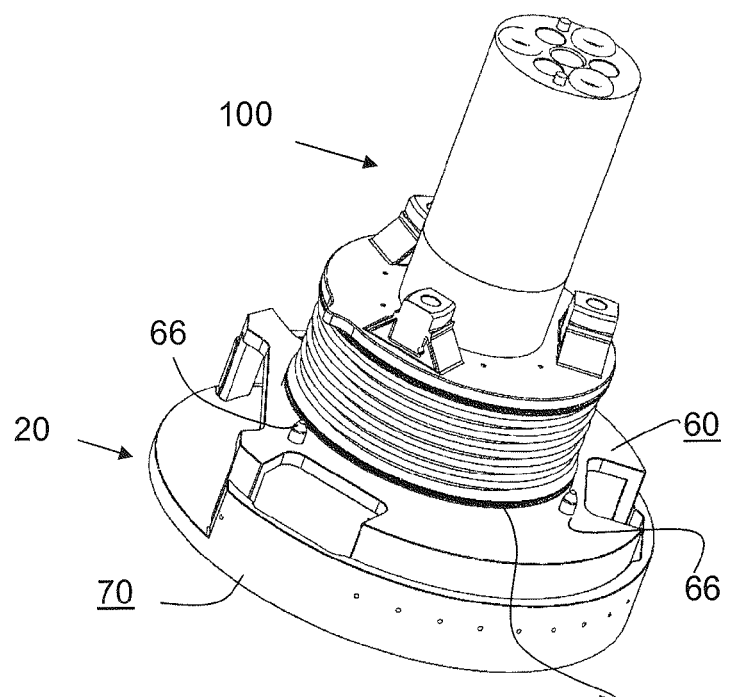
FIG. 6C shows a cooling arrangement including the second embodiment of the detector module shown in FIG. 6B, according to an embodiment of the present invention.

Accidentally extreme acceleration forces may act upon the cooling device 100 or the detector module 20. To prevent a lateral shift of the detector module 20 with respect to the cooling device 100, the contact surface 63 of the detector module may be provided with a profile that restricts a lateral movement of the cooling device 100 relative to the detector module 20. The contact surface 63 of the detector module 20 is, for example, provided with projections 66 as shown in FIG. 6B. FIG. 6C shows the cooling arrangement including the cooling device 100 and the detector module 20. In the arrangement of FIG. 6C the projections 66 are arranged around the periphery of the sealing ring 130, so that they prevent a lateral displacement thereof.

FIG. 6D schematically shows how the cooling module 100 is mounted in a wafer stage WS.

As the sealing ring 130 is not integral with the detector module 20, in practice an amount of gas may leak between a contact surface of the sealing ring 130 and the contact surface 63 of the detector module 20. The leakage amount will have a predictable part Ls and an unpredictable part Ld. The unpredictable part Ld will be different for various cooling arrangements, and will also differ each time a same cooling arrangement is assembled as the flatness of the contact surfaces has a certain tolerance. The unpredictable part Ld generally is relatively large as compared to the predictable part Ls. This makes it difficult and expensive to maintain a desired pressure in the space comprising the gap 140 and the space in which the cooling arrangement is arranged. If the flatness is improved, both the predictable part Ls and the unpredictable part Ld of the leakage will reduce. However, the ratio Ld/Ls of the unpredictable leakage Ld and the predictable leakage Ls remains large.

FIG. 7 shows the sealing ring 130, in a preferred embodiment of the cooling device. FIG. 7A shows a detail VIIA of the sealing ring 130 of FIG. 7. As can be seen in FIG. 7A, the sealing ring is provided with at least one groove 132 at a side facing towards the detector module 20. The groove 132 extends from inside to outside the sealing ring 130. By way of example, the ring has a diameter D of 40 mm and a thickness T of 1 mm. In this example, the groove 132 has a depth of 15 μm and a width of 1.5 mm. The groove 132 forms an opening with an area of $22.5*10^3$ μm$^2$ that provides for a controlled amount of leakage from inside the ring to the environment. Alternatively, an opening in the sealing ring 130 may be provided in the form of a hole, e.g. applied by laser drilling.

Although the predictable leakage Ls is increased in this way, the ratio Ld/Ls is strongly reduced, so that the required pressure levels can be maintained more easily.

In addition the opening can be used as an outlet to rapidly flush the enclosed space with an inert gas such as $N_2$, in case of an emergency situation. It is not necessary to provide for a separate outlet. The latter would require a separate exhaust tube, which is undesirable.

Figure 8:
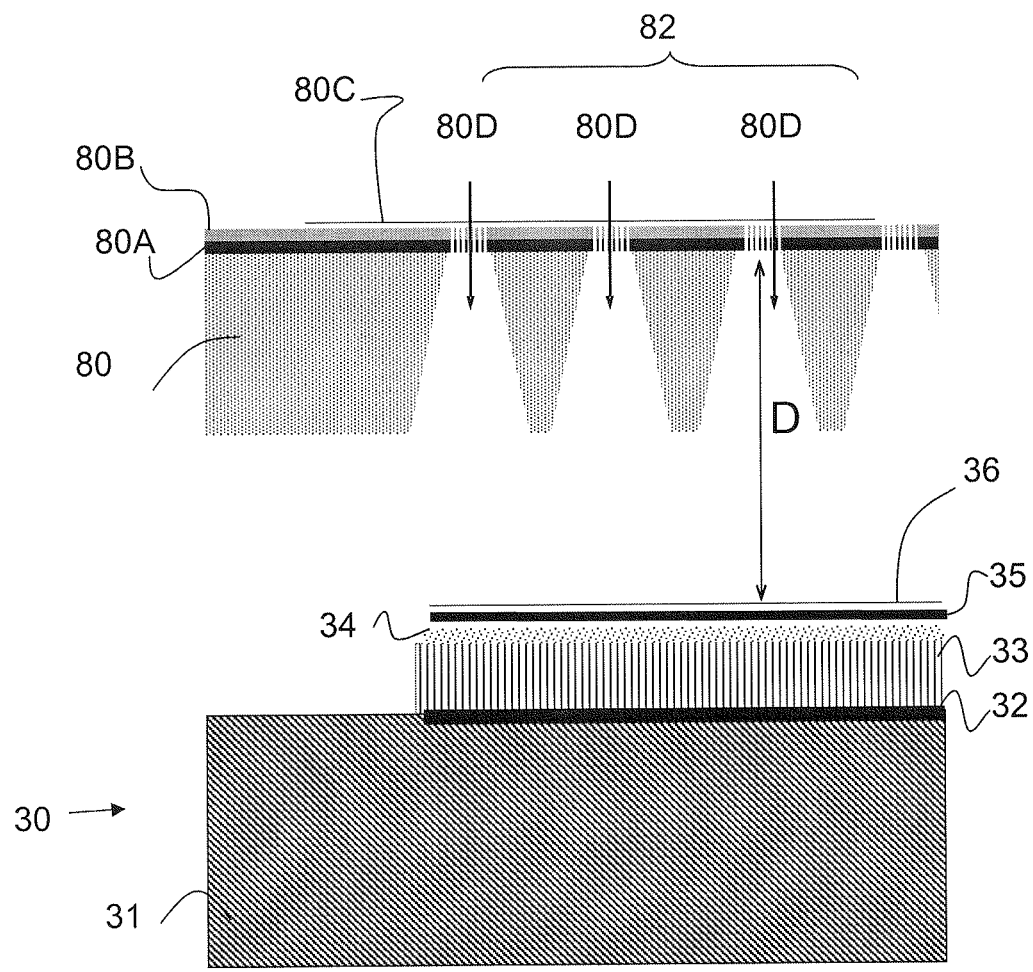
FIG. 8 shows the detector forming part of the detector module of FIGS. 4 and 5, according to an embodiment of the present invention.

FIG. 8 shows a cross section of a part of the detector module 20. Therein the grating 82 is formed as a layered structure comprising a wafer 80 of silicon. Alternatively another material like sheet metal or a ceramic material such as $Si_3N_4$ may be used. The wafer 80 is provided with a stiff foil 80A of a ceramic material such as $Si_3N_4$ or SiC or a metal like titanium, the foil 80A is covered with a patterned absorber layer 80B of nickel or chromium. Where the absorbing layer 80B has openings, the membrane 80A is etched through (real holes). Although various options are possible for the pattern, such as a checkerboard pattern, a pattern with hexagonal openings, etc., a pattern of circular pinholes 80D is preferred. Such a pattern is particularly favorable for a good heat-transfer and for a good strength, and facilitates cleaning of the grating 82. The substrate 80 has a pattern approximately conformal to that of the membrane 80A, so that it mechanically supports the membrane 80A in areas between the openings 80D, and therewith contributes to the stiffness of the grating. The layered structure is provided with a ruthenium protection layer 80C to allow cleaning of the layered structure. Alternative materials are $Si_3N_4$, Cr and TiN.

The CCD detector 30 is located at a distance D of 10 mm from the grating 82. In the embodiment shown, the CCD detector 30 includes a COMS camera chip 32 that is mounted at a printed circuit board 31. At a side facing towards the grating 82 the camera chip 32 is provided with a fiber optic plate 33. The fiber optic plate 33 enables deposition of further layers, in that it protects the camera chip 32 during the deposition of the further layers. As the fiber optic plate 33 is composed of "vertical fibers," i.e. fibers that are arranged transverse to the surface of the camera chip 32, it hardly influences imaging capability. A first layer deposited on the fiber optic plate 33 is a layer 34 of scintillating material, e.g. YAG:Ce. The layer 34 converts the UV-radiation into a wavelength for which the camera chip 32 has a good sensitivity. The layer 34 is covered with a layer 35 of zirconium that functions as a spectral purity filter. Although any other material serving as a spectral purity filter is suitable, a layer of Zr or Si is preferred. The stack formed by layers 31-35 is provided with a layer 36 of ruthenium as a cleaning-resistant-layer. The layer 36 should be vacuum compatible, hence have low outgassing characteristics, and should further have a relatively low absorption. Apart from ruthenium, other materials like TiN and CrN may be used for this layer 36.

Figure 9:
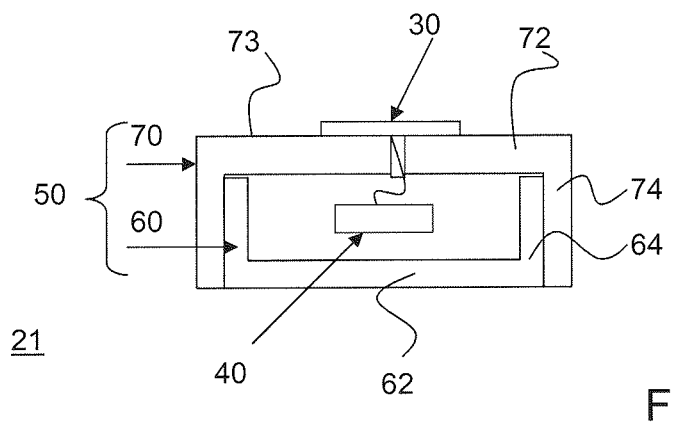
FIG. 9 shows in cross-section a third embodiment of a detector module, according to the present invention.
Figure 10:
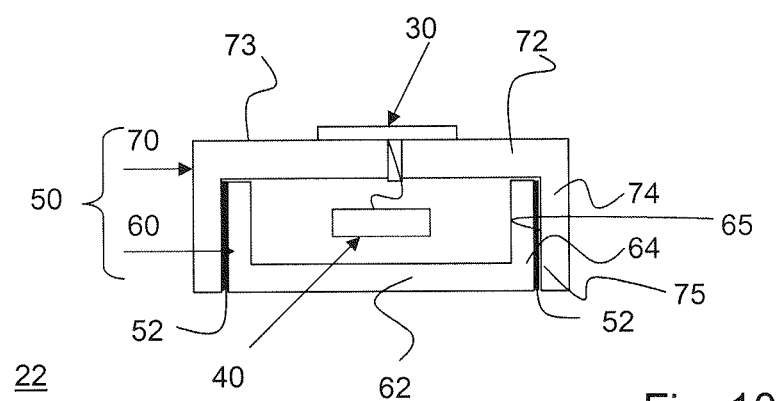
FIG. 10 shows in cross-section a fourth embodiment of a detector module, according to the present invention.

It is not necessary that the detector 30 is arranged inside the housing 50. FIGS. 9 and 10 show two alternative embodiments wherein the detector 30 is arranged at an outer surface of the housing 50, here the outer surface 73 of the bottom part 72 of the second body 70. In the embodiment of the detector 21 shown in FIG. 9, the at least cylindrical part 64 of the first body 60 fits closely within the cylindrical part 74 of the second body 70.

In an embodiment of the detector arrangement 22 shown in FIG. 10, the at least partially cylindrical part 64 of the first body 60 is thermally coupled with the at least partially cylindrical part 74 of the second body 70 by an adhesive layer 52 arranged between an outer surface 65 of the at least partially cylindrical part 64 of the first body 60 and an inner surface 75 of the at least partially cylindrical part 74 of the second body 70. In this embodiment, the first and the second bodies 60, 70 are manufactured from a ceramic material. Various ceramic materials offer a good electrical and thermal conductivity, as well as a low expansion coefficient. In an embodiment the bodies 60, 70 are manufactured of SiC that is applied by chemical vapor deposition (CVD) at a graphite mold. After completion of the deposition process, the mold is removed, for example by combustion. Optionally, the resulting body may be grinded and/or polished in the desired shape.

Alternatively, a silicon carbide body may be foiled by other suitable deposition or film forming techniques, such as plasma enhanced chemical vapor deposition (PECVD), RF glow discharge, RF sputtering, ion cluster beam deposition, ion beam sputtering, sol gel coating, reactive sputtering, plasma spray, reactant spraying, microwave discharge, and photo CVD.

In an alternative embodiment, the bodies are formed from a reaction-bonded, silicon infiltrated silicon carbide (SiSiC) material. The composition of the green body includes some carbon and the high temperature firing occurs in the presence of an excess of Si. As the molten Si diffuses through the body, it reacts with carbon to form a beta SiC bond and the remaining open porosity is filled with the excess silicon. According to the shape of the item to be delivered, the green body may be formed for example using a mold, e.g., by a slip casting. Therein a slip comprising a suspension of the ceramic material in a liquid is poured into a plaster piece mold. Some of the water in the suspension is absorbed by the plaster and a layer of stiffened material collects on the surface of the mold. When this layer is thick enough to form a cast, the excess slip is poured off and the mold is removed. The hollow slip cast is then dried and fired. Alternatively the ceramic material may be directly pressed into a mold.

The adhesive material 52 is for example an epoxy resin. A very suitable epoxy resin to be used for the adhesive layer 52 is an epoxy resin selected from the group consisting of Bisphenol A and Bisphenol F families, as these epoxy resins are relatively less sensitive to moisture. In particular, an epoxy manufactured by Epoxy Technology (Billerica, Mass., USA), named Epo-tek 302-3M®, has shown to be very suitable due to the low moisture sensitivity and good capillary action.

In order to additionally promote a good electrical conduction between the bodies, an adhesive material comprising a conductive material may be used, such as a silver paste. Examples of commercially available pastes are H21D from Epotech or C56C from Eccobond. The materials SiC and SiSiC used for the bodies 60, 70 also have a good electrical conductivity. Other electrically conductive ceramic materials are carbides such as TiC, ZrC, VC, TaC, $Mo_2C$, WC, SiC, etc., nitrides such as TiN, ZrN, VN, NbN, TaN, $Cr_2$ N, etc., carbonitride Ti (C—N), borides such as $TiB_2$, $ZrB_2$, $NbB_2$, $TaB_2$, $CrB_2$, MoB, etc., silicides such as $TiSi_2$, $ZrSi_2$, $NbSi_2$, $CrSi_2$, $MoSi_2$, $WSi_2$, etc., single conductive ceramic such as $TiO_2$-x, conductive materials such as complex ceramics containing two types or more of these substances, and complex ceramics with $Si_a N_4$, sialon, $Al_2 O_3$, $ZrO_2$, etc.

Also, semimetallic ceramic conductors are known. Like metals, these materials have overlapping electron energy bands and are therefore excellent electronic conductors. Examples of semimetallic ceramics are lead oxide (PbO), ruthenium dioxide ($RuO_2$), bismuth ruthenate ($Bi_2Ru_2O_7$), and bismuth iridate ($Bi_2Ir_2O_7$).

Figure 11:
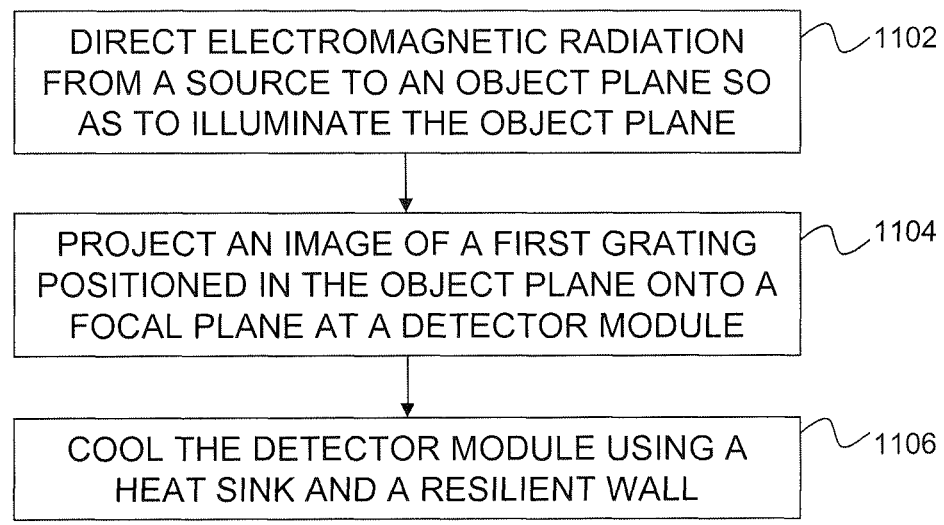
FIG. 11 is a flowchart showing a method of measuring a wavefront, according to an embodiment of the present invention.

FIG. 11 is a flowchart showing a method 1100 of measuring a wavefront, according to an embodiment of the present invention. In step 1102, electromagnetic radiation is directed from a source to an object plane so as to illuminate the object plane. In step 1104, an image of a first grating positioned in the object plane is projected onto a focal plane at a detector module. In step 1106, the detector module is cooled using a heat sink and a resilient wall, such as shown in the embodiments discussed above with reference to FIGS. 4-10. Wavefront aberrations caused, for example, by an optical system in the optical path of the electromagnetic radiation can then be inspected or measured at the focal plane. The cooling of the detector module prevents various negative effects on the operation of the detector module caused by heat, for example, from the electromagnetic radiation and/or by the circuitry found within the detector module.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein may encompass all types of electromagnetic radiation, including ultraviolet (UV) radiation (e.g., having a wavelength of or about 365, 248, 193, 157 or 126 nm) or extreme ultraviolet radiation.

The term "lens," where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g., semiconductor memory, magnetic or optical disk) having such a computer program stored therein. Further, the machine readable instruction may be embodied in two or more computer programs. The two or more computer programs may be stored on one or more different memories and/or data storage media.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. For example, the first and the second embodiment of the detector module may also be used in combination with a heat sink, for example a heat sink as shown in FIG. 6. Any reference signs in the claims should not be construed as limiting the scope.

What is claimed is:

1. A cooling arrangement comprising:
a detector module comprising a detector and a housing partially enclosing the detector, wherein the housing has a first thermal contact surface;
a heat sink having a second thermal contact surface facing the first thermal contact surface; and
a resilient wall configured to create a gap between the first thermal contact surface and the second thermal contact surface, and surrounding the heat sink and a space at least comprising the gap, and
wherein the cooling arrangement is configured to maintain a pressure difference between said space and an environment of the cooling arrangement and to transport heat from the first thermal contact surface to the second thermal contact surface to thereby cool the detector module.

2. A cooling arrangement according to claim 1, wherein the space is filled with a gas.

3. A cooling arrangement according to claim 1, wherein the space is configured to receive a gas.

4. A cooling arrangement according to claim 1, wherein the resilient wall is a bellows.

5. A cooling arrangement according to claim 1, wherein the resilient wall has a first end coupled to at least one of the housing of the detector module and the heat sink, and a second end configured to contact the other one of the at least one of the housing of the detector module and the heat sink to define the gap.

6. A cooling arrangement according to claim 5, wherein the second end comprises a sealing ring configured to contact the other one of the at least one of the housing of the detector module and the heat sink.

7. A cooling arrangement according to claim 6, wherein the sealing ring is provided with an opening.

8. A cooling arrangement according to claim 7, wherein the opening is formed by at least one groove on surface that contacts the other one of the at least one of the housing of the detector module and the heat sink.

9. A cooling arrangement according to claim 1, wherein the detector module is configured to receive radiation, and wherein the first thermal contact surface is on a side of the housing of the detector module opposite of a side of the housing of the detector module configured to receive the radiation.

10. A cooling arrangement according to claim 9, wherein the resilient wall contacts the first thermal contact surface.

11. A cooling arrangement according to claim 1, wherein the housing of the detector module comprises a first body and a separate second body thermally coupled to the first body, the first body comprising an outer surface defining the first thermal contact surface.

12. A cooling arrangement according to claim 11, wherein the detector is positioned within a cavity defined by the first and second bodies.

13. A cooling arrangement according to claim 12, wherein the detector module is configured to receive radiation, and wherein the detector is coupled to an outside surface of the second body on a side of the housing of the detector module configured to receive the radiation.

14. A cooling arrangement according to claim 12, wherein the detector is coupled to an inside surface of the first body.

15. A lithographic apparatus comprising:
an imaging system configured to direct electromagnetic radiation at an object plane so as to illuminate the object plane;
a first grating positioned in the object plane;
a projection optical system configured to project an image of the first grating onto a focal plane; and
a cooling arrangement comprising:
a detector module comprising a detector and a housing partially enclosing the detector, wherein the housing has a first thermal contact surface;
a heat sink having a second thermal contact surface facing the first thermal contact surface; and
a resilient wall configured to create gap between the first thermal contact surface and the second thermal contact surface, and surrounding the heat sink and a space at least comprising the gap,
wherein the cooling arrangement is configured to maintain a pressure difference between said space and an environment of the cooling arrangement and to transport heat from the first thermal contact surface to the second thermal contact surface to thereby cool the detector module, and
wherein the detector module is configured to receive the image projected by the projection optical system.

16. A method of cooling a detector module, the detector module comprising a detector and a housing partially enclosing the detector, wherein the housing has a first thermal contact surface, the method comprising:
mounting the detector module to a cooling device comprising:
a heat sink having a second thermal contact surface facing the first thermal contact surface; and
a resilient wall configured to create a gap between the first thermal contact surface and the second thermal contact surface, and surrounding the heat sink and a space at least comprising the gap;
maintaining a pressure difference between the space and an environment of the cooling arrangement; and
transport heat from the first thermal contact surface to the second thermal contact surface to thereby cool the detector module.

17. A method of measuring a wavefront, the method comprising;
directing electromagnetic radiation to an object plane so as to illuminate the object plane;
projecting an image of a first grating positioned in the object plane onto a focal plane at a detector module, the detector module comprising a detector and a housing partially enclosing the detector, wherein the housing has a first thermal contact surface; and
arranging the first thermal contact surface proximate to and facing a second thermal contact surface of a heat sink such that a gap is formed between the first thermal contact surface and the second thermal contact surface;
arranging a resilient wall to surround the heat sink and a space at least comprising the gap;
maintaining a pressure difference between the space and an environment external to the resilient wall; and
measuring the wavefront at the focal plane;
wherein heat from the first thermal contact surface is transported to the second thermal contact surface to cool the detector module.

* * * * *

UNITED STATES PATENT AND TRADEMARK OFFICE
CERTIFICATE OF CORRECTION

PATENT NO.      : 8,817,228 B2  
APPLICATION NO. : 12/750337  
DATED           : August 26, 2014  
INVENTOR(S)     : Knarren et al.

Page 1 of 1

It is certified that error appears in the above-identified patent and that said Letters Patent is hereby corrected as shown below:

On the Title Page, Item (56), Reference Cited section, under "FOREIGN PATENT DOCUMENTS", please delete "2006-525590" and insert --2009-525590--.

In the Claims  
In column 18, line 67, claim 8, after "one grove on", please insert --a--.  
In column 19, line 37, claim 15, after "sink", please delete "haying" and insert --having--.  
In column 20, line 21, claim 16, after "heat", please delete "transport" and insert --transporting--.  
In column 20, line 25, claim 17, after "comprising", please delete ";" and insert --:--.

Signed and Sealed this  
Seventeenth Day of February, 2015

Michelle K. Lee  
*Deputy Director of the United States Patent and Trademark Office*